(12) United States Patent
Lee

(10) Patent No.: US 7,973,526 B2
(45) Date of Patent: Jul. 5, 2011

(54) REFERENCE VOLTAGE GENERATOR HAVING IMPROVED SETUP VOLTAGE CHARACTERISTICS AND METHOD OF CONTROLLING THE SAME

(75) Inventor: Jun-phyo Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 12/038,371

(22) Filed: Feb. 27, 2008

(65) Prior Publication Data

US 2008/0203987 A1 Aug. 28, 2008

(30) Foreign Application Priority Data

Feb. 27, 2007 (KR) .................. 10-2007-0019920

(51) Int. Cl.
*G05F 3/16* (2006.01)
*G05F 1/00* (2006.01)

(52) U.S. Cl. ........................................ 323/314; 323/284

(58) Field of Classification Search .................. 323/314, 323/901, 907, 282–284, 313
See application file for complete search history.

(56) References Cited

U.S. PATENT DOCUMENTS

| | | | | |
|---|---|---|---|---|
| 5,065,456 A * | 11/1991 | Nakayama | ...................... | 398/197 |
| 6,160,392 A * | 12/2000 | Shin | .............................. | 323/313 |
| 6,617,835 B2 * | 9/2003 | Nishimura | .................... | 323/313 |
| 7,161,396 B1 * | 1/2007 | Zhou et al. | .................... | 327/143 |
| 2002/0153870 A1 * | 10/2002 | Lim | ................................ | 323/315 |
| 2002/0175663 A1 * | 11/2002 | Jang | .............................. | 323/313 |
| 2005/0073341 A1 * | 4/2005 | Lim | ................................ | 327/143 |
| 2005/0231246 A1 * | 10/2005 | Kang et al. | ...................... | 327/143 |
| 2006/0038606 A1 * | 2/2006 | Chen et al. | ..................... | 327/536 |
| 2007/0058458 A1 * | 3/2007 | Pan | .......................... | 365/189.09 |
| 2007/0103118 A1 * | 5/2007 | Takagi et al. | ................. | 320/130 |
| 2007/0273406 A1 * | 11/2007 | Kang et al. | ....................... | 326/83 |
| 2008/0198677 A1 * | 8/2008 | Son | ................................ | 365/226 |
| 2009/0073775 A1 * | 3/2009 | Lee | ........................... | 365/185.25 |

FOREIGN PATENT DOCUMENTS

| | | |
|---|---|---|
| JP | 11-095847 | 4/1999 |
| KR | 1020010065691 A | 7/2001 |
| KR | 1020050038848 A | 4/2005 |
| KR | 1020050099308 A | 10/2005 |
| KR | 1020050101038 A | 10/2005 |

OTHER PUBLICATIONS

KR Office Action dated Apr. 24, 2008 RE Corresponding Korean Application No. 10-2007-0019920.

\* cited by examiner

*Primary Examiner* — Gary L Laxton
*Assistant Examiner* — Jeffrey Gblende
(74) *Attorney, Agent, or Firm* — F. Chau & Associates, LLC

(57) ABSTRACT

A reference voltage generator for improving setup voltage characteristics without an increase in a standby current and a method of controlling the same, in which the reference voltage generator includes: a reference voltage generation unit including a resistor connected between a power supply voltage and an output node, for dividing the power voltage, and generating a reference voltage fed to the output node thereof; a voltage detector receiving a feedback of the reference voltage and detecting a level of the reference voltage; and a bypass circuit connected in parallel to the resistor of the reference voltage generation unit and bypassing the resistor in response to an output signal of the voltage detector.

9 Claims, 3 Drawing Sheets

REFERENCE VOLTAGE GENERATOR HAVING IMPROVED SETUP VOLTAGE CHARACTERISTICS AND METHOD OF CONTROLLING THE SAME

CROSS-REFERENCE TO RELATED PATENT APPLICATION

This application claims the priority of Korean Patent Application No. 10-2007-0019920, filed on Feb. 27, 2007, in the Korean Intellectual Property Office, the disclosure of which is incorporated herein in its entirety by reference.

BACKGROUND OF THE INVENTION

1. Technical Field

The present disclosure relates to a semiconductor integrated circuit and, more particularly, to a reference voltage generator for improving setup voltage characteristics without an increase in a standby current.

2. Discussion of Related Art

A reference voltage is generally used to determine a logic level of data. More specifically, data lower than the reference voltage is determined as a logic low level, and data higher than the reference voltage is determined as a logic high level. Thus, if a reference voltage level varies, a data logic level may be erroneously determined. In addition, the reference voltage can be used to generate an internal power voltage in a memory device, such as DRAM.

The reference voltage should always have a constant value even in the face of variations of a process, a temperature, and a power supply voltage. A circuit for generating the reference voltage must have good setup voltage characteristics. A variety of types of circuits are used to generate the reference voltage, and one example of a reference voltage generator is disclosed in U.S. Pat. No. 5,309,083 A.

FIG. 1 is a circuit diagram of a conventional reference voltage generator. FIG. 2 is a plot of voltages illustrating characteristics of the conventional reference voltage generator.

Referring to FIG. 1, the conventional reference voltage generator includes a voltage divider 11 that divides a power supply voltage VDD and outputs a reference voltage VREF to an output device, and a reference voltage controller 13 that controls the level of the reference voltage VREF in response to the control voltage VCON generated from the voltage divider 11.

The voltage divider 11 includes two resistors RS and R and two NMOS transistors N1 and N2. The reference voltage controller 13 includes a PMOS transistor P1.

The conventional reference voltage generator, however, determines a setup voltage VSET of the reference voltage VREF according to the resistor RS. In more detail, the smaller the value of the resistor RS becomes, the lower the setup voltage VSET becomes, resulting in the improvement of the setup voltage characteristics but causing an increase in a standby current.

SUMMARY OF THE INVENTION

Exemplary embodiments of the present invention provide a reference voltage generator for improving setup voltage characteristics without an increase in a standby current.

Exemplary embodiments of the present invention also provide a method of controlling a reference voltage generator for improving setup voltage characteristics without an increase in a standby current.

According to an exemplary embodiment of the present invention, there is provided a reference voltage generator comprising: a reference voltage generation unit including a resistor connected between a power voltage and an output end, dividing the power voltage, and generating a reference voltage to the output end thereof; a voltage detector receiving a feedback of the reference voltage and detecting a level of the reference voltage; and a bypass circuit connected in parallel to the resistor of the reference voltage generation unit and bypassing the resistor in response to an output signal of the voltage detector.

The voltage detector may comprise: a voltage divider dividing the power voltage and outputting it to an output end thereof; a pull up unit connected between the power voltage and the output end of the voltage divider, and controlling a voltage level of the output end of the voltage divider in response to the feedback reference voltage; a first inverter inverting a signal of the output end of the voltage divider; and a second inverter inverting an output signal of the first inverter and generating an output signal of the voltage detector.

The bypass circuit may comprise: a PMOS transistor connected in parallel to the resistor of the reference voltage generation unit, and applying an output signal of the voltage detector to a gate thereof.

The reference voltage generation unit may comprise: a voltage divider dividing the power voltage and outputting the reference voltage to the output end thereof; and a reference voltage controller controlling a level of the reference voltage in response to a control voltage generated by the voltage divider.

According to an exemplary embodiment of the present invention, there is provided a method of controlling a reference voltage generation unit that includes a resistor connected between a power voltage and an output end, that divides the power voltage, and generates a reference voltage to the output end thereof, the method comprising: receiving a feedback of the reference voltage and detecting a level of the reference voltage; and bypassing the resistor in response to an output signal of the voltage detector based on the detection result.

The detecting of the level of the reference voltage may comprise: dividing the power voltage and outputting it to an output end thereof; controlling a voltage level of the output end of the voltage divider in response to the feedback reference voltage; inverting a signal of the output end of the voltage divider; and inverting an output signal of the first inverter and generating an output signal of the voltage detector.

The bypassing of the resistor may comprise: bypassing the resistor if the level of the reference voltage is lower than a predetermined level; and not bypassing the resistor if the level of the reference voltage is higher than the predetermined level.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
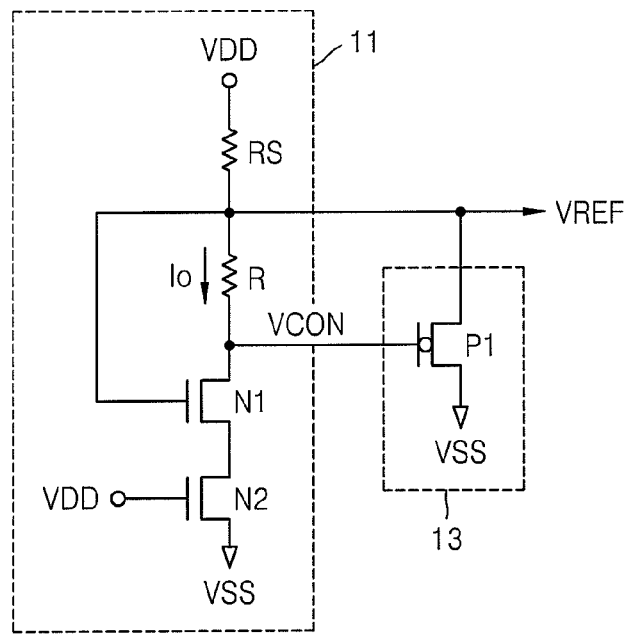
FIG. 1 is a circuit diagram of a conventional reference voltage generator.
Figure 2:
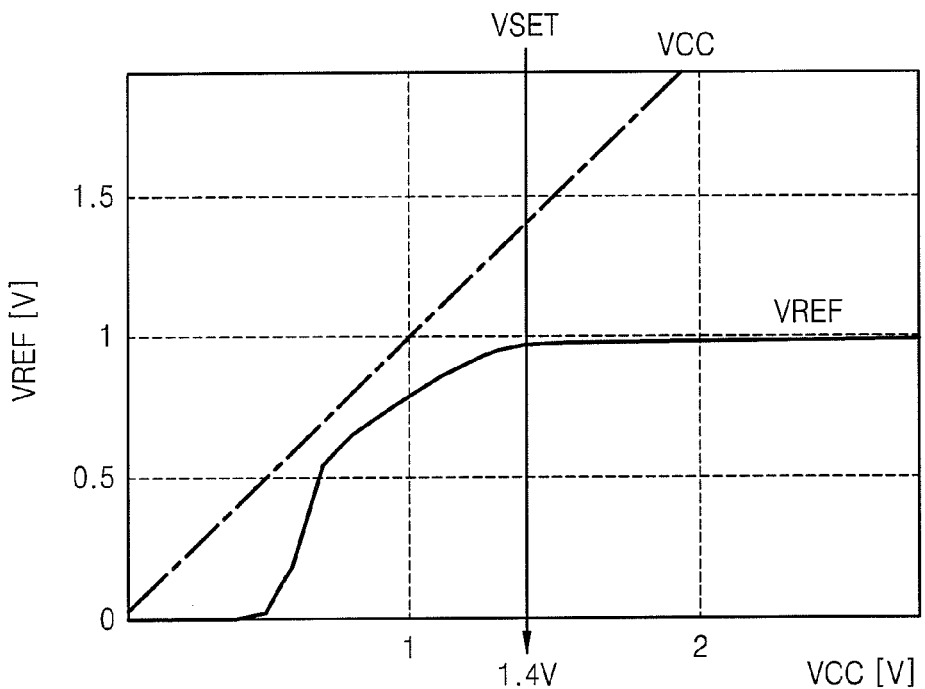
FIG. 2 is a voltage waveform illustrating characteristics of the conventional reference voltage generator.

Hereinafter, an exemplary embodiment of the present invention will be described in detail with reference the accompanying drawings. Like reference numerals are used to designate like or equivalent elements throughout this disclosure.

Figure 3:
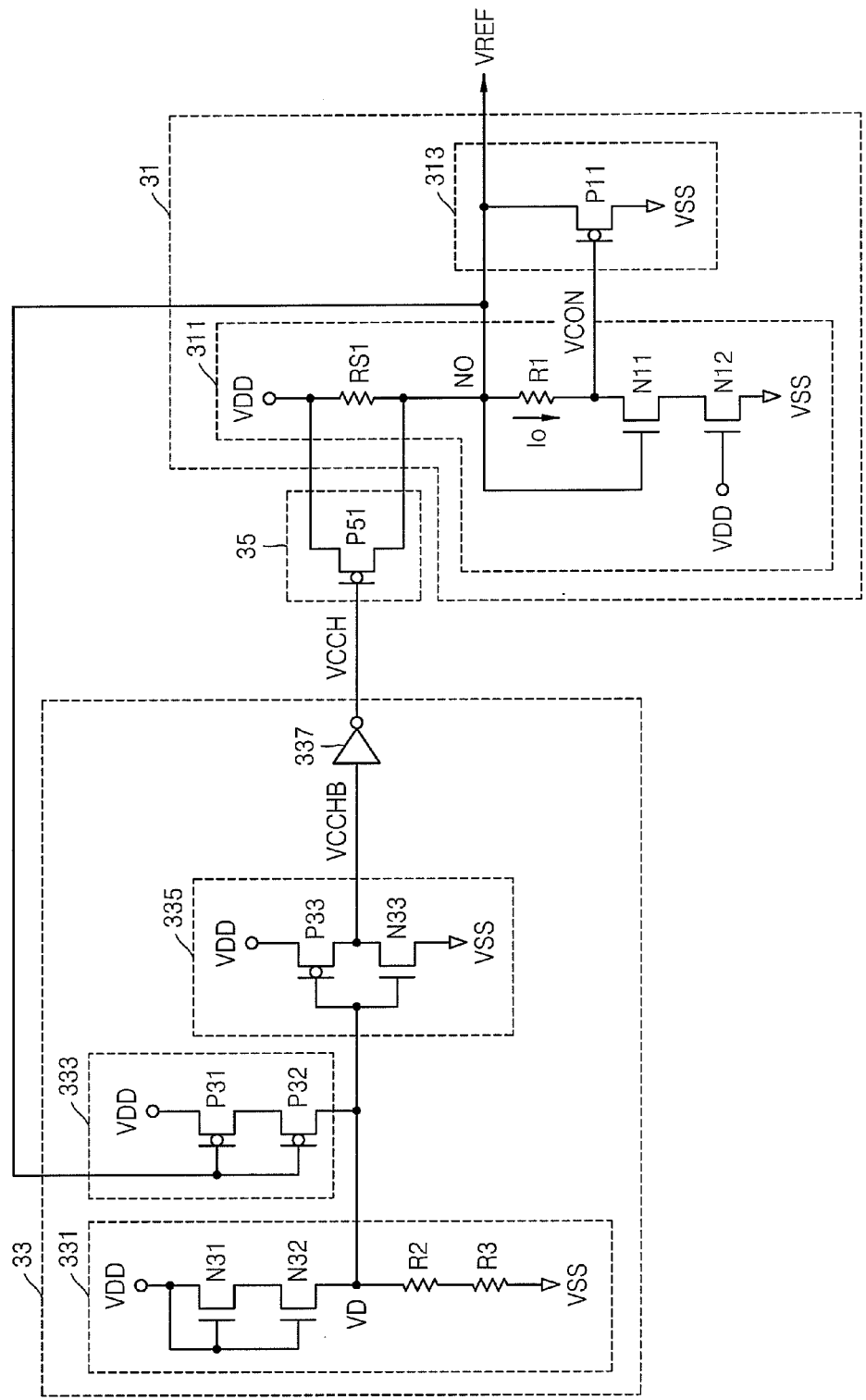
FIG. 3 is a circuit diagram of a reference voltage generator according to an exemplary embodiment of the present invention.

FIG. 3 is a circuit diagram of a reference voltage generator according to an exemplary embodiment of the present invention. Referring to FIG. 3, the reference voltage generator includes a reference voltage generation unit 31, a voltage detector 33, and a bypass circuit 35. The reference voltage generator is controlled using a method of controlling the reference voltage generator according to an exemplary embodiment of the present invention.

The reference voltage generation unit 31 divides a power supply voltage VDD and generates a reference voltage VREF fed to an output node NO thereof. The voltage detector 33 receives a feedback of the reference voltage VREF and detects a level of the reference voltage VREF. The bypass circuit 35 is connected in parallel to a resistor RS1 of the reference voltage generation unit 31 and bypasses the resistor RS1 in response to an output signal VCCH of the voltage detector 33.

The voltage detector 33 includes a voltage divider 331, a pull-up unit 333, a first inverter 335, and a second inverter 337.

The voltage divider 331 outputs the divided power voltage VDD to an output node VD thereof. The voltage divider 331 includes two NMOS transistors N31 and N32 that are serially connected between the power voltage VDD and the output node VD, and two resistors R2 and R3 that are serially connected between the output end VD and a ground voltage VSS. The power voltage VDD is applied to gates of the NMOS transistors N31 and N32.

The voltage divider 331 of this exemplary embodiment includes the two NMOS transistors N31 and N32 but is not necessarily limited thereto. It will be seen that the voltage divider 331 of this exemplary embodiment of the present invention can include one NMOS transistor or three or more NMOS transistors. The voltage divider 331 of the present exemplary embodiment includes the two resistors R2 and R3 but is not necessarily limited thereto. It will be seen that the voltage divider 331 of the present invention can include one resistor or three or more resistors.

The pull-up unit 333 is connected between the power supply voltage VDD and the output node VD of the voltage divider 331, and controls a voltage level at the output node VD of the voltage divider 331 in response to the feedback reference voltage VREF. The pull-up unit 333 includes two PMOS transistors P31 and P32 that are serially connected between the power supply voltage VDD and the output node VD of the voltage divider 331, and apply the feedback reference voltage VREF to gates thereof. The pull-up unit 333 of this exemplary embodiment of the present embodiment includes the two PMOS transistors P31 and P32 but is not necessarily limited thereto. It will be seen that the pull-up unit 333 of this exemplary embodiment of the present invention can include one PMOS transistor or three or more PMOS transistors.

The first inverter 335 inverts and outputs a signal of the output node VD of the voltage divider 331. The first inverter 335 includes the PMOS transistor P33 and the NMOS transistor N33. The second inverter 337 inverts an output signal VCCHB of the first inverter 335 and generates the output signal VCCH.

The bypass circuit 35 includes a PMOS transistor P51 that is connected in parallel to the resistor RS1 of the reference voltage generation unit 31, and has the output signal VCCH of the voltage detector 33 applied to a gate thereof.

The reference voltage generation unit 31, which is a circuit for generating a general reference voltage, includes a voltage divider 311 and a reference voltage controller 313.

The voltage divider 311 divides the power supply voltage VDD and outputs the reference voltage VREF to the output node NO thereof. The voltage divider 311 includes the resistor RS1 connected between the power supply voltage VDD and the output node NO of the reference voltage VREF, another resistor R1 having one end connected to the resistor RS1, and two NMOS transistors N11 and N12 connected between the other end of the resistor R1 and a ground voltage VSS. The reference voltage VREF is applied to a gate of the NMOS transistor N11. The power supply voltage VDD is applied to a gate of the NMOS transistor N12. A control voltage VCON is output from the resistor R1 and a connection point of the NMOS transistor N11.

The voltage divider 311 of the present exemplary embodiment includes the two NMOS transistors N11 and N12 but is not necessarily limited thereto. It will be seen that the voltage divider 311 of this exemplary embodiment of the present invention can include one NMOS transistor or three or more NMOS transistors. The voltage divider 311 of the present exemplary embodiment includes the two resistors RS1 and R1 but is not necessarily limited thereto. It will be seen that the voltage divider 311 of this exemplary embodiment of the present invention can include one resistor or three or more resistors.

The reference voltage controller 313 controls a level of the reference voltage VREF in response to the control voltage VCON. The reference voltage controller 313 includes a PMOS transistor P11 that is connected between the reference voltage VREF and the ground voltage VSS, and that is controlled by the control voltage VCON.

Figure 4:
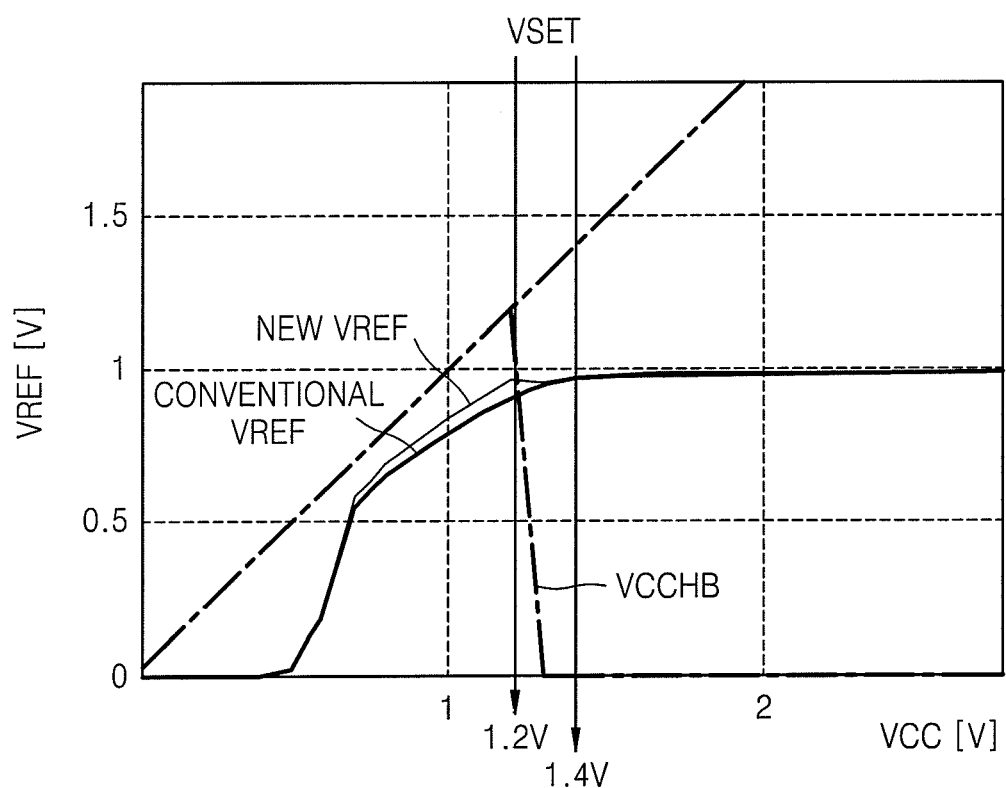
FIG. 4 is a voltage waveform diagram of simulation results of the characteristics of the reference voltage generator illustrated in FIG. 3 and the conventional reference voltage generator illustrated in FIG. 1.

FIG. 4 is a voltage waveform diagram of simulation results of the characteristics of the reference voltage generator illustrated in FIG. 3 and the conventional reference voltage generator illustrated in FIG. 1. The simulation conditions are that the transistors and resistors of the reference voltage generator 31 of the reference voltage generator illustrated in FIG. 3 have the same values as those of the conventional reference voltage generator illustrated in FIG. 1. More specifically, a standby current flowing through the reference voltage generator illustrated in FIG. 3 is identical to that in the conventional reference voltage generator illustrated in FIG. 1.

Referring to FIG. 4, a conventional VREF indicates a reference voltage generated by the conventional reference voltage generator illustrated in FIG. 1, and a new VREF indicates a reference voltage generated by the reference voltage generator illustrated in FIG. 3. VCCHB indicates an output signal of the first inverter 335 of the voltage detector 33 illustrated in FIG. 3.

The operation of the reference voltage generator illustrated in FIG. 3 for improving setup voltage characteristics will now be described with reference to FIG. 4.

An initial voltage level of the output node VD of the voltage divider 331 of the voltage detector 33 is low. Thus, the output signal VCCHB of the first inverter 335 is powered up and then has a predetermined high level according to an increase in the power supply voltage VDD. An output signal VCCH of the second inverter 337 has a low level so that the PMOS transistor P51 of the bypass circuit 35 is turned on. As a result, the resistor RS1 of the reference voltage generation unit 31 is bypassed so that the reference voltage VREF generated from the reference voltage generator 31 is quickly set up to a predetermined level.

After the reference voltage VREF is set up to the predetermined level, the voltage level of the output node VD of the voltage divider 331 becomes high through the pull-up unit 333 of the voltage detector 33. Therefore, the output signal VCCHB of the first inverter 335 has a low level, and the output signal VCCH of the second inverter 337 has a high level. Thus, the PMOS transistor P51 of the bypass circuit 35 is turned off. The resistor RS1 of the reference voltage generation unit 31 is not bypassed, but the reference voltage generation unit 31 operates normally. The operation of the reference voltage generator 31 is known to those of ordinary skill in the art, and thus its detailed description is omitted.

The set up voltage VSET of the conventional reference voltage generator is about 1.4 volts, whereas the set up voltage VSET of the reference voltage generator of an exemplary embodiment of the present invention is about 1.2 volts. In other words, the set up voltage characteristics of the reference voltage generator of an exemplary embodiment of the present invention has been improved compared to those of the conventional reference voltage generator.

As described above, the reference voltage generator of an exemplary embodiment of the present invention can improve the set up voltage characteristics without an increase in the standby current.

While the present invention has been particularly shown and described with reference to exemplary embodiments thereof, it will be understood by those of ordinary skill in the art that various changes in form and details may be made therein without departing from the spirit and scope of the present invention, as defined by the following claims.

What is claimed is:

1. A reference voltage generator comprising:
   a reference voltage generation unit including a resistor connected between a power supply voltage and an output node, for dividing the power voltage and generating a reference voltage to the output node thereof;
   a voltage detector receiving a feedback of the reference voltage and detecting a level of the reference voltage; and
   a bypass circuit bypassing the resistor in response to an output signal of the voltage detector, wherein the bypass circuit comprises a MOSFET transistor connected in parallel to the resistor, and a gate of the MOSFET transistor receives the output signal,
   wherein the voltage detector turns on the bypass circuit to bypass the resistor until the reference voltage is set up to a predetermined level, and turns off the bypass circuit after the reference voltage is set up to the predetermined level, wherein the voltage detector comprises:
   a voltage divider dividing the power supply voltage and outputting a divided voltage to an output node thereof;
   a pull-up unit connected between the power supply voltage and the output node of the voltage divider, and controlling a voltage level of the output node of the voltage divider in response to the fed back reference voltage;
   a first inverter inverting a signal of the output node of the voltage divider; and
   a second inverter inverting an output signal of the first inverter and generating an output signal of the voltage detector.

2. The reference voltage generator of claim 1, wherein the voltage divider further comprises:
   a plurality of NMOS transistors serially connected between the power supply voltage and an output node thereof; and
   a plurality of resistors serially connected between the output node and a ground voltage,
   wherein the power supply voltage VDD is applied to gates of the plurality of NMOS transistors.

3. The reference voltage generator of claim 1, wherein the pull-up unit comprises: a plurality of PMOS transistors serially connected between the power supply voltage and the output node of the voltage divider, and the reference voltage is fed back to gates thereof.

4. The reference voltage generator of claim 1, wherein the MOSFET transistor of the bypass circuit comprises: a PMOS transistor.

5. The reference voltage generator of claim 1, wherein the reference voltage generation unit comprises:
   a voltage divider dividing the power supply voltage and outputting the reference voltage to the output node thereof; and
   a reference voltage controller controlling a level of the reference voltage in response to a control voltage generated by the voltage divider.

6. The reference voltage generator of claim 5, wherein the voltage divider of the reference voltage generation unit comprises:
   at least one first resistor connected between the power supply voltage and the output node from which the reference voltage is output;
   at least one second resistor having one end connected to the first resistor; and
   at least one NMOS transistor connected between another end of the second resistor and a ground voltage,
   wherein a control voltage is output from the other end of the second resistor.

7. The reference voltage generator of claim 6, wherein one of the reference voltage and the power supply voltage is applied to a gate of the NMOS transistor.

8. The reference voltage generator of claim 5, wherein the reference voltage controller comprises: a PMOS transistor connected between the reference voltage and a ground voltage and controlled by the control voltage.

9. A method of controlling a reference voltage generation unit that includes a resistor connected between a power supply voltage and an output node, divides the power supply voltage, and generates a reference voltage fed to the output node thereof, the method comprising:
   receiving by a voltage detector a feedback of the reference voltage and the voltage detector generating an output signal based on detecting a level of the reference voltage; and
   bypassing the resistor by sending the output signal of the voltage detector to a gate of a MOSFET transistor in parallel with the resistor,
   wherein the bypassing is performed until the reference voltage is set up to a predetermined level and the bypassing ceases after the reference voltage is set up to the predetermined level, wherein the detecting the level of the reference voltage comprises:
   dividing by a voltage divider the power supply voltage and outputting the divided voltage to an output node thereof;
   controlling a voltage level of the output node of the voltage divider in response to the reference voltage that is fed back;
   inverting a signal of the output node of the voltage divider; and
   inverting an output signal of an inverter performing the inverting and generating the output signal of the voltage detector.

* * * * *